United States Patent [19]

Coppola et al.

[11] Patent Number: 5,010,335

[45] Date of Patent: Apr. 23, 1991

[54] OPTICAL PORT MULTIPLEXER FOR ELECTRIC METERING EQUIPMENT

[75] Inventors: Richard Coppola, Norcross; Farrokh Khandaghabadi, Lawrenceville, both of Ga.

[73] Assignee: Schlumberger Industries, Inc., Norcross, Ga.

[21] Appl. No.: 527,684

[22] Filed: May 21, 1990

Related U.S. Application Data

[63] Continuation of Ser. No. 277,164, Nov. 29, 1988, abandoned.

[51] Int. Cl.[5] .................... G08B 17/00; G01R 13/04
[52] U.S. Cl. .................... 340/870.28; 340/870.02; 324/96; 324/113; 324/157; 346/14 MR
[58] Field of Search ............ 340/870.02, 870.03, 340/870.28; 455/606; 324/157, 96, 113, 116, 103 R; 346/14 MR

[56] References Cited

U.S. PATENT DOCUMENTS

| 3,943,498 | 3/1976 | McClelland, III | 340/206 |
| 4,298,839 | 11/1981 | Johnston | 324/157 |
| 4,491,791 | 1/1985 | Balch et al. | 324/157 |
| 4,491,792 | 1/1985 | Bullock et al. | 324/157 |
| 4,584,527 | 4/1986 | Amigo | 324/157 |

Primary Examiner—Donald J. Yusko
Assistant Examiner—Michael Horablk
Attorney, Agent, or Firm—Sanford J. Asman

[57] ABSTRACT

A single optical port in an electric meter is multiplexed between at least two internal systems by using a multiplexer circuit which has a set of data lines which can be connected to the optical port and to one of the internal systems. The multiplexer is controlled by means of a magnetic reed switch which is mounted within the cover of the meter, so no mechanical changes to the meter cover are required.

10 Claims, 1 Drawing Sheet

OPTICAL PORT MULTIPLEXER FOR ELECTRIC METERING EQUIPMENT

This application is a continuation of application Ser. No. 07/277,164, filed on Nov. 29, 1988 now abandoned, entitled OPTICAL PORT MULTIPLEXER FOR ELECTRIC METERING EQUIPMENT.

BACKGROUND OF THE INVENTION

The present invention relates to a multiplexed optical port for electric metering equipment. In particular, the invention relates to an optical port multiplexer for an electric meter of the type which uses a glass cover.

Commonly used electric meters and registers make use of cases which typically include a glass (or other transparent) cover. Such equipment can include, within the cover, a variety of options, such as the ability to meter a variety of parameters over different time periods. In the past, a variety of means have been used to "read" electric meters. Such means included having a meter reader actually read numbers off mechanical dials located within the glass cover. Newer, solid-state meters typically have liquid crystal displays (LCDs) which can be visually read by a meter reader. Alternatively, a number of solid state meters make use of an optical port which can be used to read the contents of registers within the meter by means of a hand held unit called a "retriever/programmer", which unit can also be used to program the various functions within the solid state meter.

In a number of situations, it is desirable to add additional features to an existing meter which already has an optical port. For example, it may be desirable to add a recorder feature, which is capable of recording pulses verses time, to an existing register, of the type which normally does not have such a feature. In order to avoid having to redesign the cover and add an additional optical port, it would be desirable to be able to multiplex a single optical port. However, such multiplexing normally requires some means for selecting the system, internal to the meter, with which the optical port is to be used.

The problem which presents itself involves the question of how to multiplex the optical port without having to change the mechanical design of the meter cover in order to permit retrofitting additional features relatively easily, i.e., without major mechanical modifications. Thus, a first concern involves avoiding the addition of an external switch or additional optical ports. This could be accomplished by using a "master/slave configuration", in which one of the systems performs the task of multiplexing the data lines by means of an internal processor. Alternatively, it could be accomplished by using a microprocessor based intelligent gateway. Either of these approaches would respond to signals provided through a single optical port by the external retriever, but both would require substantial cost in circuitry internal to the meter. In addition, it would require changes in the firmware of both the meter systems and the external retriever. Accordingly, a second, equally important problem, involves the question of how to multiplex a single optical port without having to change the electrical design or the firmware of the meter or the retriever.

SUMMARY OF THE INVENTION

In accordance with the present invention, an optical port in an electric meter can be multiplexed by using a multiplexer circuit which has a set of data lines which can be connected to the optical port and to one of a plurality of systems internal to the meter. The multiplexer is controlled by means of a magnetic reed switch which is mounted within the cover of the meter.

BRIEF DESCRIPTION OF THE DRAWING

The sole FIGURE of the drawing is a schematic view of the multiplexed optical port of the present invention.

DETAILED DESCRIPTION OF AN EXEMPLARY EMBODIMENT

Figure 1:
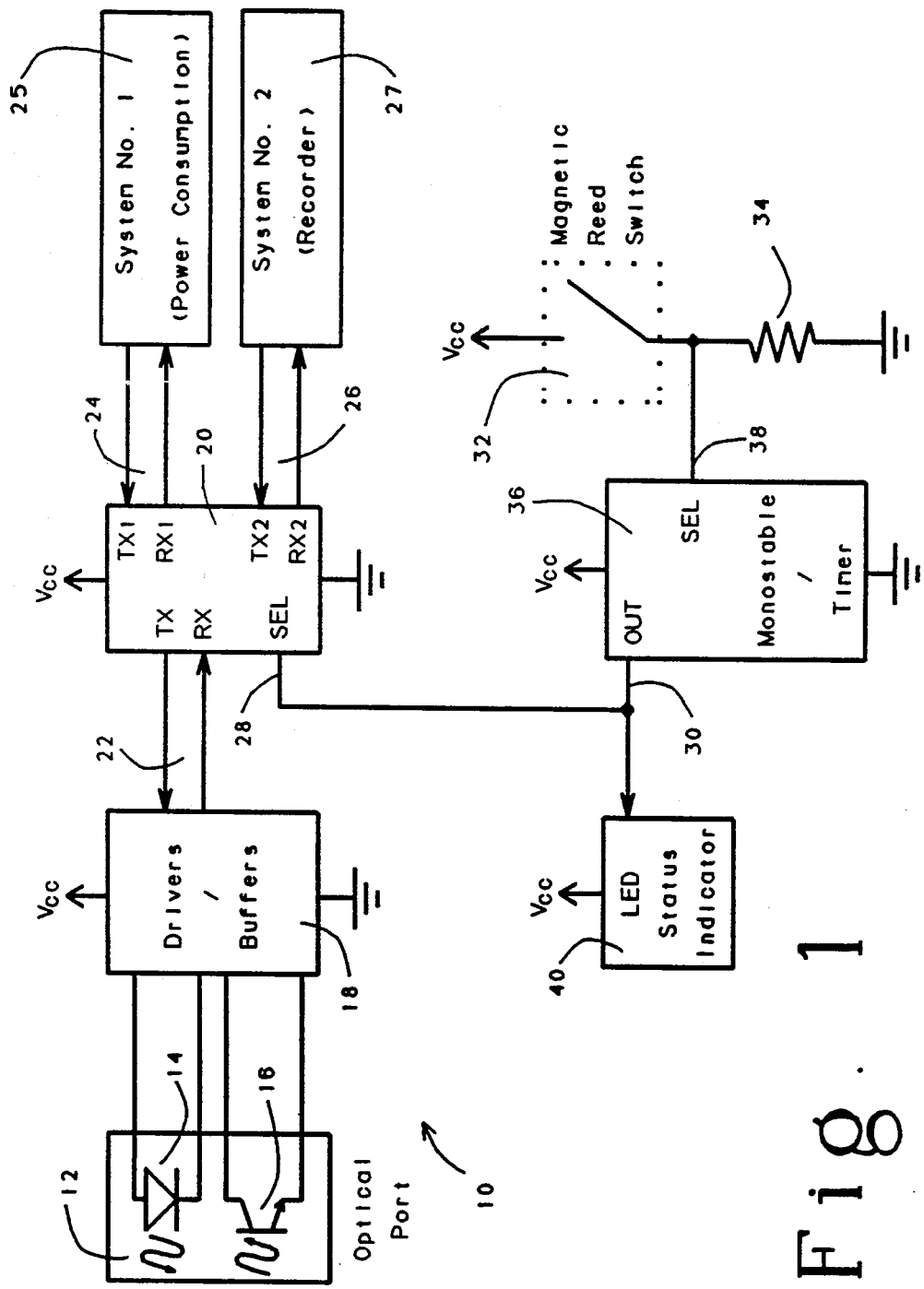

Referring now to FIG. 1, a schematic diagram of the present invention 10 is shown. The invention 10 comprises an optical port 12 which consists of an LED 14 and a phototransistor 16. The optical port 12 is connected to drivers and buffers shown schematically as Drivers/Buffers unit 18. The purpose of the drivers within the drivers/buffers unit 18 is to drive the LED 14, while the buffers within the Drivers/Buffers unit 18 are used to shape the output signal of the phototransistor 16. The drivers/buffers unit 18 communicates with a multiplexer 20 over a set of transmit-receive lines 22. In the preferred embodiment of the invention, the multiplexer is a CMOS analog multiplexer designated as 4066 which is made by Motorola. The multiplexer 20 connects the transmit-receive lines 22 to either a first system, referred to herein as System Number 1, such as a power consumption recorder 25, or, alternatively, to a second system, referred to herein as System Number 2, such as a recorder 27 which is used to record pulses representing power consumption over time, over a set of transmitreceive lines 24, 26, respectively.

The connection between the transmit-receive lines 22 and the transmit-receive lines 24 of System Number 1 or the transmit-receive lines 26 of System Number 2 is determined by a select, SEL, input 28 on the multiplexer 20. The voltage at the select input 28 on the multiplexer 20 determines whether the transmit-receive lines 24 of System Number 1, or the transmit-receive lines 26 of System Number 2, are connected via the transmit-receive lines 22 to the Drivers/Buffers unit 18. The voltage on the SEL input 28, in turn, is determined by the voltage on the output pin 30 of a Monostable/Timer circuit 36. The output of the Monostable/Timer circuit 36 is normally a low voltage which causes the SEL input 28 of the multiplexer 20 to select the transmit receive lines 24 of System Number 1. However, the output line 30 can be brought high for a period of time determined by RC components (not shown) which are associated with the Monostable/Timer circuit 36. This is done by bringing SEL line 38 at the input of the monostable/timer circuit 36 high.

In accordance with the present invention, a magnetic reed switch 32 is mounted within the glass cover of the metering device of which the present invention 10 is a part. Accordingly, when a magnet is brought up to the glass cover in an area adjacent to the magnetic reed switch 32, the SEL input 38 is connected to a positive voltage, $V_{cc}$, thereby causing the output pin 30 to go positive for the predetermined time associate with the RC components associated with the monostable/timer 36. One terminal of a resistor 34 is connected to ground.

The other terminal of the resistor 34 is connected to $V_{cc}$ through the magnetic reed switch 32 and to the SEL pin 38 on the monostable/timer 36 in order to allow the SEL pin 38 to go to $V_{cc}$ when the magnetic reed switch is closed. When the output 30 of the Monostable/Timer 36 is brought high in the manner just described, an LED status indicator 40, which is visible through the glass cover of the metering device is also turned on. The purpose of the LED status indicator 40 is to indicate to the person using the optical port 12 that is connected to System Number 2 through transmit-receive lines 26, rather than connected to the default System Number 1 through the transmit-receive lines 24.

A number of features of the present invention are well known to those with ordinary skill in the art and have not been explained herein. Also, as would be recognized by those of ordinary skill in the art, while a single magnetic reed switch 32 is used, and it is connected to the Monostable/Timer 36, it would also be possible to connect a magnetic reed switch to the select pin 28 of the multiplexer 20. In such case the optical port would be multiplexed only when the magnet was present adjacent to the reed switch. While this would present some inconvenience in that the magnet would have to remain in place during the multiplexing of the optical port, it would also allow instantaneous selection and switching of the optical port.

Similarly, a bistable multiplexer could be created wherein each time a magnet were brought adjacent to the magnetic reed switch 32 the selection of the multiplexer output 20 could be changed. Alternatively, through the use of a plurality of magnetic reed switches and multiplexers, more than two internal units could use a single optical port. These and other obvious variations are intended to be included within the scope of the present invention.

We claim:

1. An improved utility meter comprising:
   (a) at least two electronic systems each of which comprises an independent source of data within the meter, each of said electronic systems further including data lines for communicating said data from each of said electronic systems to a retriever device;
   (b) an optical port for transferring data from a selected one of said electronic systems to said retriever device, said optical port having data lines which can be connected to said data lines of said electronic systems;
   (c) a multiplexer circuit within the meter and electrically connected between said optical port and said electronic systems for selectively connecting said data lines of one of said electronic systems to said data lines of said optical port; and
   (d) a magnetic reed switch positioned within said utility meter proximate to a glass cover for switching said multiplexer circuit in response to noninvasive presence of a reed switch actuating means outside said glass cover within the operative proximity of said magnetic reed switch, said reed switch actuating means being independent of said retriever device, whereby said data lines of said selected one of said electronic systems are selectively connected to said data lines of said optical port.

2. The improved utility meter of claim 1 wherein one of said electronic systems comprises means for measuring power consumption.

3. The improved utility meter of claim 1 wherein one of said electronic systems is a recorder which is used to record pulses representing power consumption over time.

4. The improved utility meter of claim 1 wherein said multiplexer circuit is a CMOS analog multiplexer.

5. The improved utility meter of claim 1, further comprising timing means responsive to actuation of aid magnetic reed switch for switching said multiplexer circuit to select the data lines of said selected one of said electronic systems for a predetermined time period.

6. The improved utility meter of claim 5, wherein said timing means is operative to switch back to a default one of said electronic systems after expiration of said predetermined time period.

7. The improved utility meter of claim 5, wherein said timing means comprises a monostable timer circuit.

8. The improved utility meter of claim 1, wherein said actuating means comprises a magnet.

9. An improved utility meter comprising:
   (a) at least two electronic systems each of which comprises an independent source of data relating to the operation of said utility meter, each of said electronic systems further including data lines for communicating said data from each of said electronic systems to a retriever device;
   (b) a magnetic reed switch positioned within an enclosure for said utility meter for providing a switching signal in response to placement of a magnet outside said enclosure but within operative proximity of said magnetic reed switch;
   (c) a multiplexer circuit within the meter responsive to said switching signal for connecting said data lines of a selected one of said electronic systems to a multiplexer output;
   (d) an optical port for transferring data from said selected one of said electronic systems to said retriever device, said optical port having data lines connected to said multiplexer output; and
   (e) timing means responsive to actuation of said magnetic reed switch for switching said multiplexer circuit to select the data lines of said selected one of said electronic systems for a predetermined time period, and thereafter to switch back to a default one of said electronic systems after expiration of said predetermined time period.

10. The improved utility meter of claim 9, wherein said magnetic reed switch is positioned inside said enclosure for said utility meter but proximate to a glass cover for said utility meter.

* * * * *